(12) United States Patent
Kim et al.

(10) Patent No.: US 10,403,775 B2
(45) Date of Patent: Sep. 3, 2019

(54) SOLAR CELL MODULE

(71) Applicant: LG ELECTRONICS INC., Seoul (KR)

(72) Inventors: Byongsu Kim, Seoul (KR); Sungho Chang, Seoul (KR); Sukwon Kim, Seoul (KR); Sanghwan Park, Seoul (KR); Kyungchan Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/366,782

(22) Filed: Dec. 1, 2016

(65) Prior Publication Data

US 2017/0186896 A1    Jun. 29, 2017

(30) Foreign Application Priority Data

Dec. 23, 2015 (KR) .................. 10-2015-0184773

(51) Int. Cl.
*H01L 31/0475* (2014.01)
*H01L 31/049* (2014.01)
(Continued)

(52) U.S. Cl.
CPC ........ *H01L 31/0475* (2014.12); *H01L 31/049* (2014.12); *H01L 31/0481* (2013.01);
(Continued)

(58) Field of Classification Search
CPC ............. H01L 31/0475; H01L 31/0481; H01L 31/049; H01L 31/0516
See application file for complete search history.

(56) References Cited

U.S. PATENT DOCUMENTS

| | | | |
|---|---|---|---|
| 2003/0096102 A1* | 5/2003 | Yoshihara | G02B 1/111 428/330 |
| 2007/0012352 A1* | 1/2007 | Wohlgemuth | B32B 17/10018 136/251 |

(Continued)

FOREIGN PATENT DOCUMENTS

| | | |
|---|---|---|
| EP | 2913921 A1 | 9/2015 |
| JP | 2000-347003 A | 12/2000 |

(Continued)

OTHER PUBLICATIONS

KO 2014/0075925 A online machine translation as provided by Patent Translate: Powered by EPO and Google, translated on Sep. 7, 2017.*

(Continued)

*Primary Examiner* — Golam Mowla
(74) *Attorney, Agent, or Firm* — Birch, Stewart, Kolasch & Birch, LLP

(57) ABSTRACT

A solar cell module is disclosed. The solar cell module includes a plurality of solar cells, a front transparent substrate located in a front surface of the plurality of solar cells, a back transparent substrate located on a back surface of the plurality of solar cells, a front protection unit located between the front transparent substrate and the plurality of solar cells, and a back protection unit located between the back transparent substrate and the plurality of solar cells. The back transparent substrate includes an anti-reflection layer.

19 Claims, 10 Drawing Sheets

(51) Int. Cl.
*H01L 31/048* (2014.01)
*H01L 31/05* (2014.01)
*H02S 40/20* (2014.01)

(52) U.S. Cl.
CPC .......... *H01L 31/0516* (2013.01); *H02S 40/20* (2014.12); *Y02E 10/50* (2013.01)

(56) References Cited

U.S. PATENT DOCUMENTS

| | | | |
|---|---|---|---|
| 2012/0048353 A1 | 3/2012 | Woo et al. | |
| 2013/0209776 A1* | 8/2013 | Kim | H02S 40/42 428/220 |
| 2013/0263922 A1* | 10/2013 | Jung | H01L 31/18 136/256 |
| 2014/0041716 A1* | 2/2014 | Kang | H01L 31/049 136/251 |
| 2014/0090708 A1* | 4/2014 | Kang | B32B 15/085 136/259 |
| 2015/0155410 A1 | 6/2015 | Lin et al. | |
| 2015/0236181 A1* | 8/2015 | Baccini | H01L 31/0516 136/256 |

FOREIGN PATENT DOCUMENTS

| | | |
|---|---|---|
| JP | 2003-62921 A | 3/2003 |
| JP | 2003-152202 A | 5/2003 |
| JP | 2012-44106 A | 3/2012 |
| JP | 2012-140581 A | 7/2012 |
| JP | 2013-203881 A | 10/2013 |
| JP | 2015-533028 A | 11/2015 |
| KR | 10-2014-0075925 A | 6/2014 |
| WO | WO 2008/045511 A2 | 4/2008 |

OTHER PUBLICATIONS

Ortabasi, "Performance of a 2X Cusp Concentrator PV Module Using Bifacial Solar Cells," IEEE 26th PVSC, Sep. 30-Oct. 3, 1997, Anaheim, CA, pp. 1177-1181.

* cited by examiner

SOLAR CELL MODULE

CROSS-REFERENCE TO RELATED APPLICATION

This application claims priority to and the benefit of Korean Patent Application No. 10-2015-0184773, filed in the Korean Intellectual Property Office on Dec. 23, 2015, the entire contents of which are incorporated herein by reference.

BACKGROUND OF THE INVENTION

Field of the Invention

Embodiments of the invention relate to a solar cell module.

Background of the Related Art

Recently, interest in renewable energy in accordance with global environmental problems and depletion of coal fuels has been heightened. Research and development for solar energy generation, non-polluting energy source, among them have been actively conducted.

A solar cell to which solar energy generation principle is applied is a semiconductor device, which converts sunlight into electrical energy. Generally, the solar cell is made from a single crystal or polycrystalline or amorphous silicon-based semiconductor, and has a basic structure similar to a diode.

The solar cell has to have long-term exposure to the outside environment to easily absorb sunlight. Therefore, various packaging for protecting the solar cells may be carried out, and the solar cell is made in unit form. This unit is referred to as a solar cell module.

Generally, sheets used for the packaging of the solar cells use back sheet excellent in weather resistance and durability so as to stably protect the solar cells, even when exposed to the outside environment for more than 20 years.

SUMMARY OF THE INVENTION

In one aspect, there is provided a solar cell module including a plurality of solar cells, a front transparent substrate located in a front surface of the plurality of solar cells, a back transparent substrate located on a back surface of the plurality of solar cells, a front protection unit located between the front transparent substrate and the plurality of solar cells; and a back protection unit located between the back transparent substrate and the plurality of solar cells. The back transparent substrate may include an anti-reflection layer.

The plurality of solar cells may be bifacial solar cells.

The back transparent substrate may include a base layer; a first sheet layer formed on an entire first surface of the base layer; a second sheet layer formed on an entire second surface opposite to the first surface of the base layer; and the anti-reflection layer formed on a surface of at least one of the base layer, the first sheet layer, and the second sheet layer.

The anti-reflection layer may include at least one of silicon oxide (SiOx), aluminum oxide (AlOx), or zinc oxide (ZnOx).

According to this aspect, in the bifacial solar cell, the anti-reflection layer is formed in the back sheet, and an incident light through the front surface of the solar cell is reflected and is again incident on the back surface of the solar cell. Thus, the efficiency of the back surface of the solar cell increases.

Accordingly, the efficiency of the solar cell is improved, and the efficiency of the solar cell module having a plurality of solar cells is also improved.

DETAILED DESCRIPTION OF THE EMBODIMENTS

Figure 1:
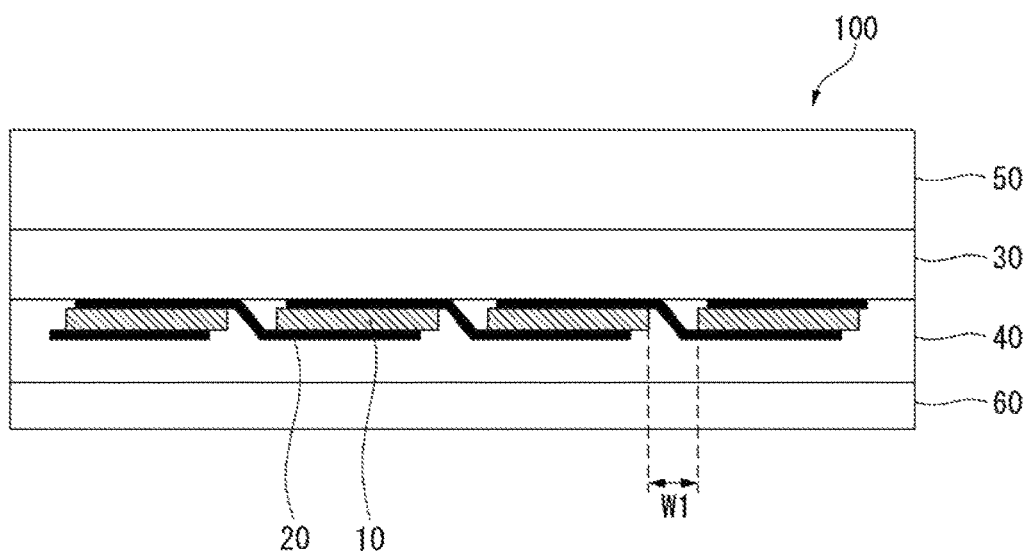
FIG. 1 and FIG. 2 are cross-sectional views for schematically illustrating an example of a solar cell module according to an embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be "directly on" the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface (or the front surface) of the another element and may not be on a portion of an edge of the another element.

In the following description, "front surface" of a component may be one surface of a module, on which light is directly incident, and "back surface" of a component may be a surface opposite to the one surface of the module, on which light is not directly incident or reflective light may be incident.

In the following description, the fact that a thickness or a width of a component is equal to a thickness or a width of another component indicates that they have the same value within a margin of error of 10% including a process error.

Then, with reference to the accompanying drawings, a solar cell module according to an embodiment of the invention is described.

Figure 2:
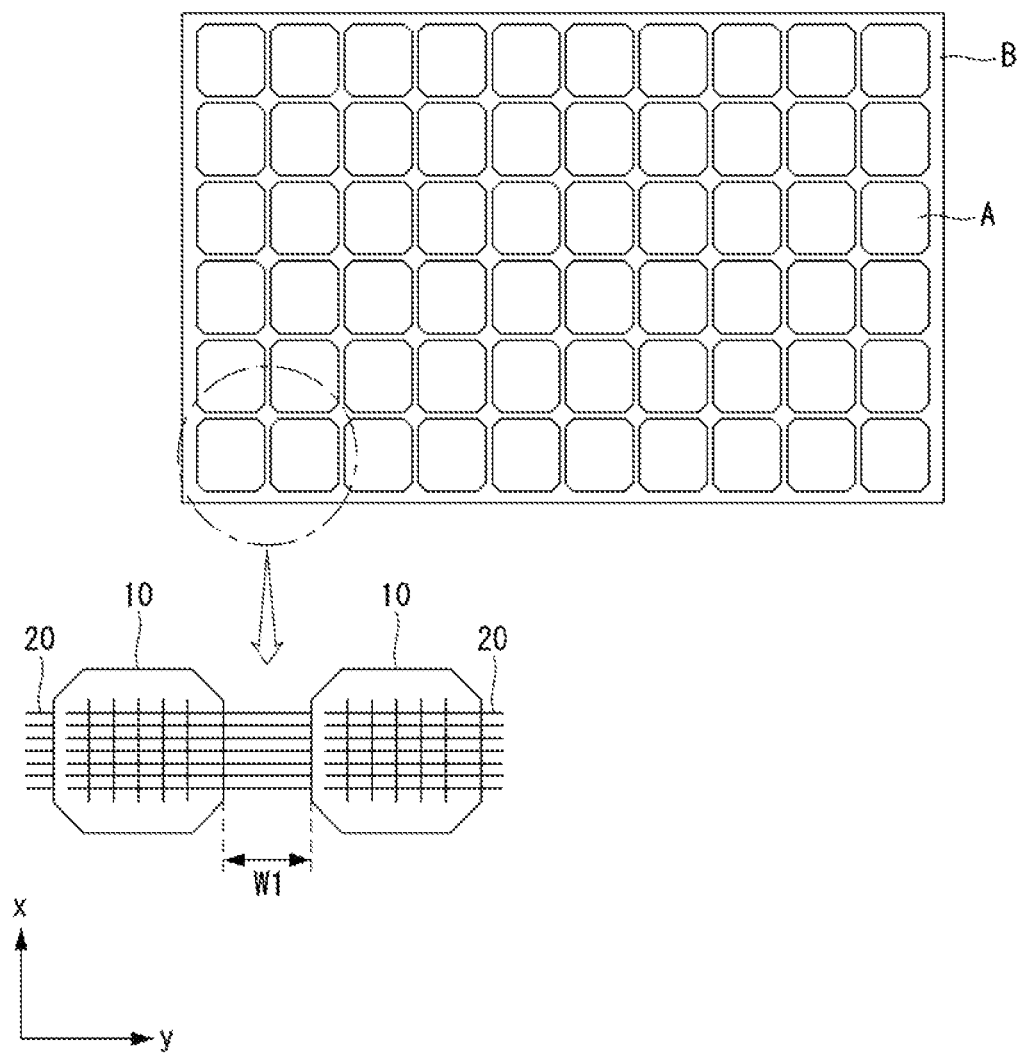

FIG. 1 and FIG. 2 are cross-sectional views schematically illustrating an example of a solar cell module according to an embodiment of the invention. Specifically, FIG. 1 is a view illustrating a shape viewed from a front of a solar cell module according to an embodiment of the invention. FIG. 2 is a view illustrating a shape viewed from a top of a solar cell module according to an embodiment of the invention.

Referring to FIGS. 1 and 2, a solar cell module 100 according to an embodiment of the invention may include a plurality of solar cells 10, an interconnector 20 electrically connecting the plurality of solar cells 10, a front protection unit 30 and a back protection unit 40 protecting the plurality of solar cells 10, a front light transmitting sheet (or a front transparent substrate) 50 which is located in a front surface of the solar cell 10, and a back sheet (or a back transparent substrate) 60 which is located on a back surface of the solar cell 10.

As shown in FIGS. 1 and 2, the solar cell 10 is a bifacial solar cell for receiving light of outside through the front surface and the back surface of the substrate. At this time, the solar cell 10 and an adjacent solar cell 10 may be located to be spaced a width W1 of about 10-50 μm apart.

As shown in FIG. 1, the front light transmitting sheet 50 is located on a first surface of the solar cell 10, for example, a light-receiving surface of the solar cell 10. The front light transmitting sheet 50 may have a high transmittance and be made of tempered glass in order to avoid a damage. In this instance, the tempered glass may be low iron tempered glass with low iron content. An inner surface of the front light transmitting sheet 50 may be processed with embossing or texturing in order to enhance a light scattering effect. At this time, the front light transmitting sheet 50 may have a refractive index of about 1.52.

As shown in FIG. 1, the front protection unit 30 and the back protection unit 40 may be an encapsulate material to reduce or prevent corrosion of metal due to moisture penetration and protect the solar cells 10 and the solar cell module 100 from an impact.

The front protection unit 30 and the back protection unit 40 may be made of a material such as ethylene vinyl acetate (EVA), polyvinyl butyral, silicone resin, ester based resin, olefin-based resin. At this time, the front protection unit 30 and the back protection unit 40 may be formed to be bonded by lamination.

As shown in FIG. 1, the interconnector 20 connected to the plurality of solar cells 10 may be embedded into the front protection unit 30 and the back protection unit 40. At this time, a side of the solar cell 10 may be in contact with both the front protection unit 30 and the back protection unit 40. When the interconnector 20 or at least a part of the interconnector 20 and the solar cell 10 is embedded into the front protection unit 30, a position of the solar cell 10 is fixed by the front protection unit. Thus, there is a reduction in misalignment in a later modularization process.

As shown in FIG. 1, the back sheet 60 may be made of a thin sheet of an insulating material, such as FP/PE/FP (fluoropolymer/polyester/fluoropolymer). The back sheet 60, however, may be an insulation sheet made of a different insulating material.

The back sheet 60 may prevent the moisture from penetrating the back surface of the solar cell module 100, and protect the solar cell 10 from the environment. The back sheet 60 may have a multilayer structure, such as a layer for preventing moisture and oxygen penetration, a layer for preventing corrosion, and a layer having insulating properties.

As shown in FIG. 2, the back sheet 60 of the invention may include a first area A that overlaps with the solar cell 10 and a second area B of a remaining portion other than the first area A.

At this time, a size of the first region A and a size of the second region B may be varied according to a size of a formed solar cell 10.

Figure 3A:
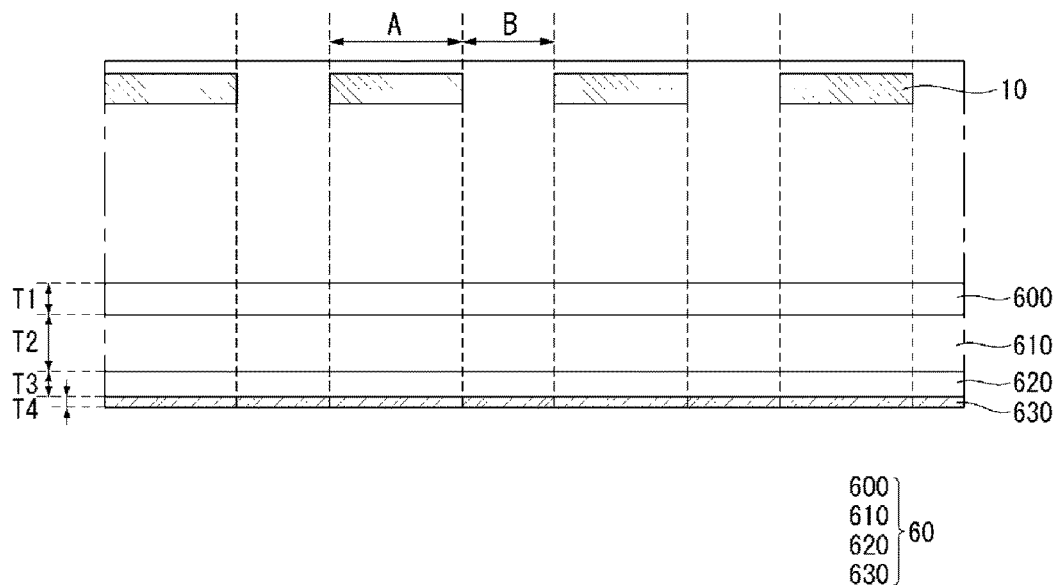
FIGS. 3A to 3C are cross-sectional views for illustrating an embodiment of formation position of an anti-reflection layer included in a back sheet shown in FIG. 1.
Figure 3B:
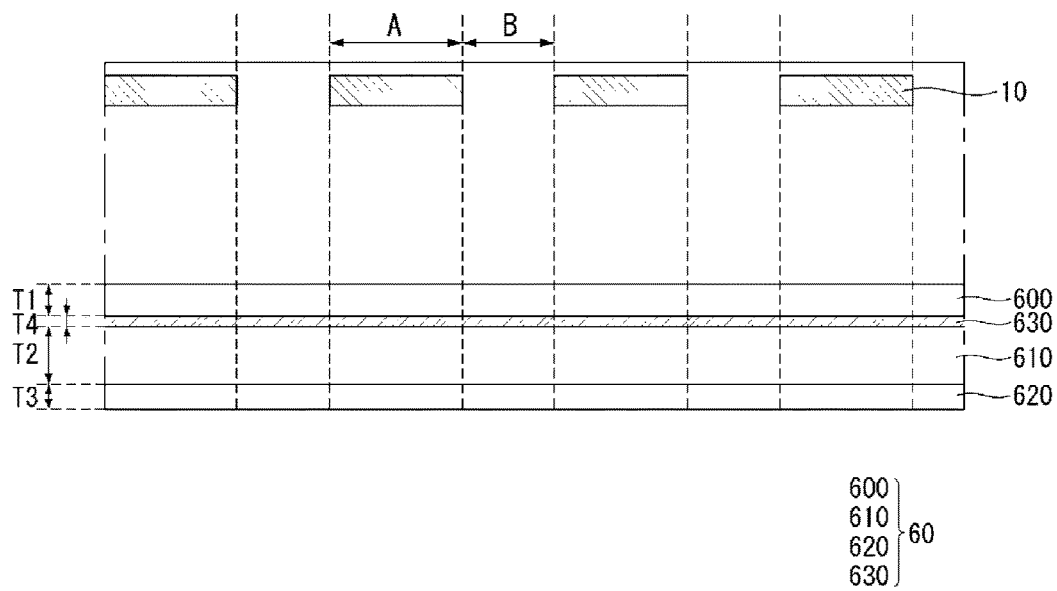
Figure 3C:
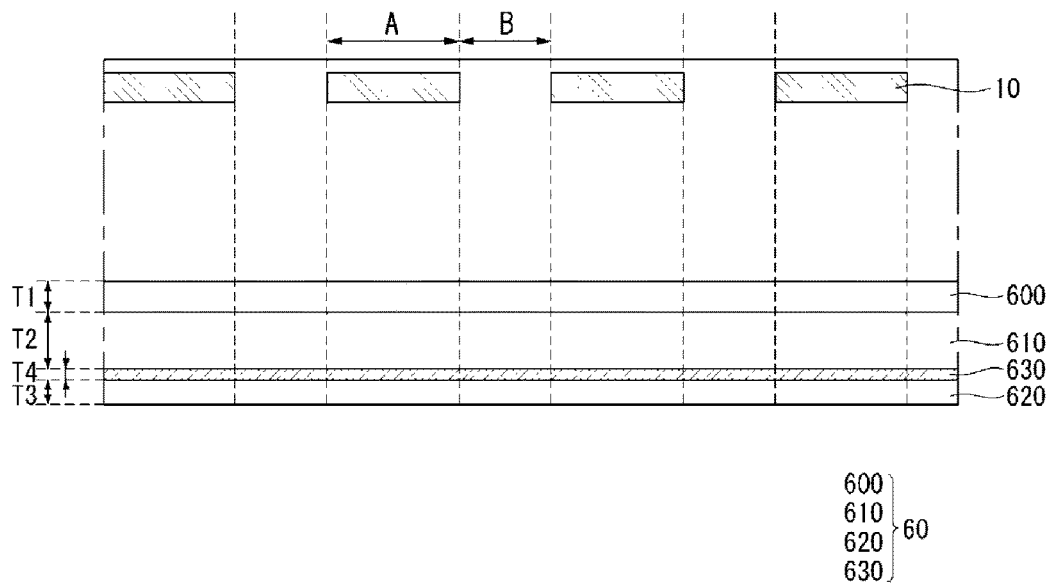

Specifically, with reference to FIGS. 3A to 3C, the back sheet 60 may include a first sheet layer 600, a base layer 610, a second sheet layer 620, and an anti-reflection layer 630.

The back sheet 60 may be preferably a film layer which is excellent in electrical insulation, mechanical properties, hydrolysis-proof properties and has low moisture transmission rate.

The first sheet layer 600 may be transparently formed on the back surface of the back protection film 40 and on location adjacent to the solar cell 10.

The first sheet layer 600 may be formed in the first area A and the second area B. The first sheet layer 600 may include at least one of fluoropolymer (FP), ethylene vinyl acetate (EVA), polypropylene (PP), and polyethylene (PE).

At this time, the polypropylene (PP) is the lightest plastic (specific gravity 0.82 to 0.92) as polymer of propylene ($CH_3CH=CH_2$). The polypropylene (PP) is superior in heat resistance, weather resistance, insulating properties, mechanical strength and the like. In particular, because molding shrinkage ratio of the polypropylene (PP) is as small as 0.1 to 0.6%, the polypropylene (PP) can reduce or prevent the back sheet 60 from being deformed by heat.

A thickness T1 of the first sheet layer 600 may be 5-250 μm. When the thickness T1 of the first sheet layer 600 is less than 5 μm, it may be difficult to have optical properties, excellent adhesive properties, and the like. On the other hand, when the thickness T1 of the first sheet layer 600 is greater than 250 μm, it may be a cause of an increase in a thickness and a cost rise.

The first sheet layer 600 may reflect light having a particular infrared (IR) wavelength and transmit or absorb light having the remaining infrared (IR) wavelength except the particular infrared (IR) wavelength. In this instance, reflecting light having the particular infrared (IR) wavelength may include an instance in which an amount of reflection is more than an amount of transmission and absorption as well as 100% reflecting. Similarly, transmitting or absorbing light having the remaining infrared (IR) wavelength except the particular infrared (IR) wavelength may include an instance in which an amount of transmission and absorption is more than an amount of reflection as well as 100% transmitting or absorbing.

For example, the first sheet layer 600 may reflect most of light of 300 nm to 1200 nm wavelength band among the entire wavelength band, and transmit or absorb most of light of the remaining wavelength band except 300 nm to 1200 nm wavelength band. Thus, the reflected light is absorbed by the solar cell 10 and can increase the efficiency of the solar cell 10. At this time, the light of 300 nm to 1200 nm wavelength band may have a transmittance of approximately 85 to 95%.

The base layer 610 may be transparently formed on the back surface of the first sheet layer 600, and support the first sheet layer 600 and the second sheet layer 620 so that the first sheet layer 600 and the second sheet layer 620 may be easily formed.

The base layer 610 may be formed on both the first area A and the second area B.

The base layer 610 may include at least one of polyethylene terephthalate (PET) and polyamide.

At this time, the polyethylene terephthalate (PET) is a saturated polyester resin obtained by condensation reaction of terephthalic acid (HOOC—($C_6H_4$)—COOH) and ethylene glycol ($HOCH_2CH_2OH$). The polyethylene terephthalate (PET) is superior in heat resistance, weather resistance, insulating properties, mechanical strength and the like. Because molding shrinkage ratio of the polyethylene terephthalate (PET) is as small as 0.1 to 0.6%, the polyethylene terephthalate (PET) can reduce or prevent the back sheet 60 from being deformed by heat.

A thickness T2 of the base layer 610 may be 30 to 400 μm. When the thickness T2 of the base layer 610 is less than 30 μm, it may be difficult to have sufficient electrical insulating properties, moisture barrier properties, and/or mechanical properties. On the other hand, when the thickness T2 of the base layer 610 is greater than 400 μm, it may be a cause of an inconvenience in handling and a cost rise.

The second sheet layer 620 may be transparently formed on the back surface of the base layer 610. The second sheet layer 620, as a layer which is located in the farthest side of the solar cell 10, may be located in the back surface of the solar cell module 100.

The second sheet layer 620 may be formed on both the first area A and the second area B.

The second sheet layer 620 may include at least one of polyethylene terephthalate (PET), polyvinyl fluoride (PVF), polyvinylidene fluoride (PVDF), ethylene tetrafluoroethylene (ETFE), and polyamide.

The thickness T3 of the second sheet layer 620 may be smaller than the thickness T1 of the first sheet layer 600 and the thickness T2 of the base layer 610. Since the second sheet layer 620 is positioned near the outer surface of the back sheet 60 than the base layer 610 and the first sheet layer 600, the second sheet layer 620 is formed of an expensive material for enhancing an insulating property, and a durability of the back sheet 60. Thus, the material for the second sheet layer 620 is more expensive than the materials for the base layer 610 and the first sheet layer 600. Accordingly, in the embodiment, the cost of the back sheet 60 can be reduced by reducing the thickness T3 of the second sheet layer 620. However, the embodiment of the invention is not limited thereto. Thus, the thickness T3 of the second sheet layer 620 may be equal to or larger than the thickness T1 of the first sheet layer 600 and the thickness T2 of base layer 610.

For example, the thickness T3 of the second sheet layer 620 may be 1 to 60 μm. When the thickness T3 of the second sheet layer 620 is less than 1 μm, reused energy may be reduced because incident light is not reflected and the incident light is not absorbed by the solar cell 10. On the other hand, when the thickness T3 of the second sheet layer 620 is greater than or equal to 60 μm, it may be a cause of a cost rise.

On the other hand, the first sheet layer 600 and the base layer 610 made of a film layer may be bonded by an adhesive layer made of an adhesive material. The base layer 610 and the second sheet layer 620 made of a film layer may be bonded by an adhesive layer made of an adhesive material.

At this time, an amount of an adhesive material between the base layer 610 and the second sheet layer 620 is equal to or less than an amount of the adhesive material between the first sheet layer 600 and the base layer 610. The reason is that the first sheet layer 600 requires high adhesive properties to be bonded to the back protection unit 40, but the sheet layer 620 is not bonded to the back protection unit 40.

The adhesive material may stably bond and fix the first sheet layer 600 to the base layer 610 and may use various materials having a high adhesive strength with respect to the back protection unit 40. For example, the adhesive material may use an acrylic or polyurethane adhesive material having a good adhesive strength with respect to the back protection unit 40.

However, the invention is not limited to this and can use various materials as an adhesive material.

Alternatively, the second sheet layer 620 may be partially coated on the base layer 610 and formed by heat treatment and/or drying.

Specifically, one of polyethylene terephthalate (PET), polyvinyl fluoride (PVF), polyvinylidene fluoride (PVDF), ethylene tetrafluoroethylene (ETFE), and polyamide may be mixed with an adhesive material. And then the mixed materials may be coated on the base layer 610. Thus, the second sheet layer 620, with the mixed materials, may be formed by heat treatment and/or drying.

A mixing method, a coating method, heat treatment and/or drying methods may be used as a variety of methods. For example, the mixing method may use a method such as milling. The coating method may use air knife coating method, dip coating method, curtain coating method, reverse roll coating method, gravure coating method, metering rod coating method, slot die coating method, and the like. The heat treatment and/or drying methods may be performed for a time of 30 seconds to 5 minutes at a temperature of 120 to 170. The temperature and time of the heat treatment and/or drying methods described above are used so that the first sheet layer 600 may be formed stably on the base layer 610. The embodiment of the invention is not limited thereto.

Hereinafter, embodiments of a formation position of the anti-reflection layer 630 included in the back sheet 60 are described.

Referring to FIG. 3A, the anti-reflection layer 630 may be located on the back surface of the second sheet layer 620 and may be formed on both the first area A and the second area B.

The anti-reflection layer 630 may be formed of at least one of silicon oxide (SiOx), aluminum oxide (AlOx), and zinc oxide (ZnOx). In embodiments of the invention, the anti-reflection layer 630 may be an oxide layer. In other embodiments of the invention, the anti-reflection layer 630 may be another inorganic layer.

The anti-reflection layer 630 may be formed on the back surface of the second sheet layer 620 by using a variety of printing methods such as spray coating method, dip coating method, bar coating method, spin coating method, screen printing method, and ink jet printing method, by roll-to-roll.

For example, the anti-reflection layer 630 may be formed on the back surface of the back protection unit 40 by spray coating method by using an organic material and additives comprising silicon oxide (SiOx), binder, and solvent. At this time, content of the silicon oxide (SiOx) may be about 1 to 5% (as an example, wt %), content of the binder may be about 1 to 5% (as an example, wt %), content of the solvent may be about 90 to 98% (as an example, wt %), and content of the additives may be less than about 3% (as an example, wt %). In this embodiment, content of the silicon oxide (SiOx) may be preferably 1.5% (as an example, wt %), content of the binder may be preferably 1.5% (as an example, wt %), content of the solvent may be preferably 96% (as an example, wt %), and content of the additives may be preferably 1% (as an example, wt %).

A thickness T4 of the anti-reflection layer 630 may be smaller than each of the other layers of the back sheet 60 (that is, the first sheet layer 600, the base layer 610, and the second sheet layer 620). Because the anti-reflection effect can be achieved by a small thickness of the anti-reflection layer 630, the thickness T4 of the anti-reflection layer 630 decreases, and thus, the thickness of the back sheet 60 can be minimized. For example, the thickness T4 of the anti-reflection layer 630 may be 80 to 150 nm. When the thickness T4 of the anti-reflection layer 630 is less than 80 nm, it may be difficult to have a passivation function and photoelectric efficiency. On the other hand, when the thickness T4 of the anti-reflection layer 630 is greater than 150 nm, it may be cause of an increase in a thickness and a cost rise.

The anti-reflection layer 630 may increase efficiency of the solar cell module 100 by reducing reflectivity of incident light to the solar cell 10 and increasing selectivity of a specific wavelength band.

In this embodiment of the solar cell module 100 including the anti-reflection layer 630, transmittance of about 70 to 83% in the conventional art rises above about 85 to 95% in the 300 nm to 1200 nm wavelength band. Thus, back surface output value rises about 1 to 7%, and back surface power generation rises about 1 to 7%. Accordingly, total power generation of the solar cell module 100 has risen about 0.5 to 4%.

Referring to FIG. 3B, the anti-reflection layer 630 may be located between the first sheet layer 600 and the base layer 610, and may be formed on both the first area A and the second area B.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T4 of the anti-reflection layer 630 may be 80 to 150 nm. When the thickness T4 of the anti-reflection layer 630 is less than 80 nm, it may be difficult to have a passivation function and photoelectric efficiency. On the other hand, when the thickness T4 of the anti-reflection layer 630 is greater than 150 nm, it may be cause of an increase in a thickness and a cost rise.

Referring to FIG. 3C, the anti-reflection layer 630 may be located between the base layer 610 and the second sheet layer 620, and may be formed on both the first area A and the second area B.

The anti-reflection layer 630 (or an anti-reflection portion or an anti-reflection material contained in the anti-reflection layer 630 or the anti-reflection portion) may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T4 of the anti-reflection layer 630 may be 80 to 150 nm. When the thickness T4 of the anti-reflection layer 630 is less than 80 nm, it may be difficult to have a passivation function and photoelectric efficiency. On the other hand, when the thickness T4 of the anti-reflection layer 630 is greater than 150 nm, it may be cause of an increase in a thickness and a cost rise.

Figure 4A:
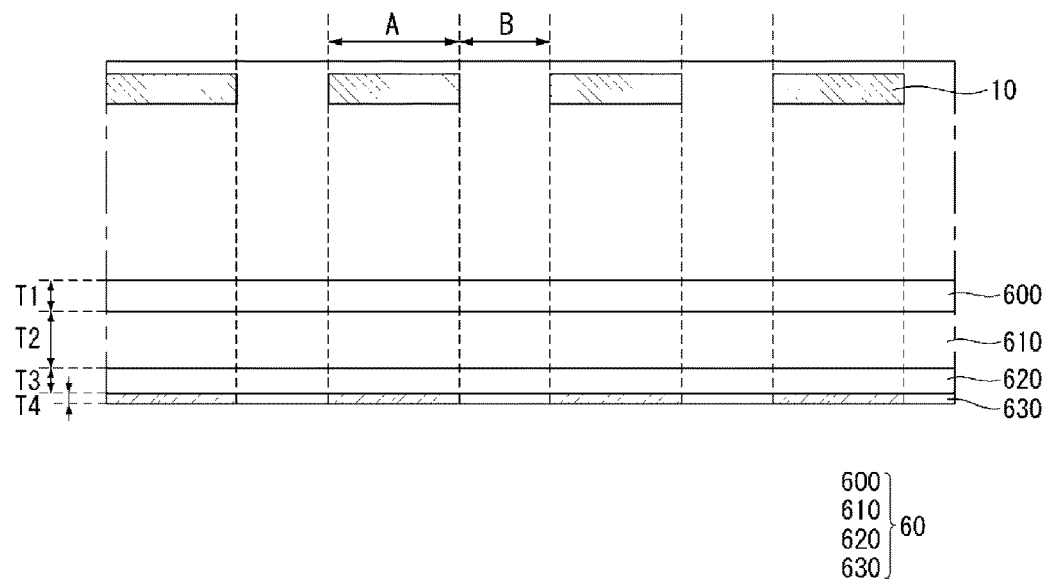
FIGS. 4A to 4C are cross-sectional views for illustrating an embodiment of formation position of an anti-reflection layer included in a back sheet shown in FIG. 1.
Figure 10:
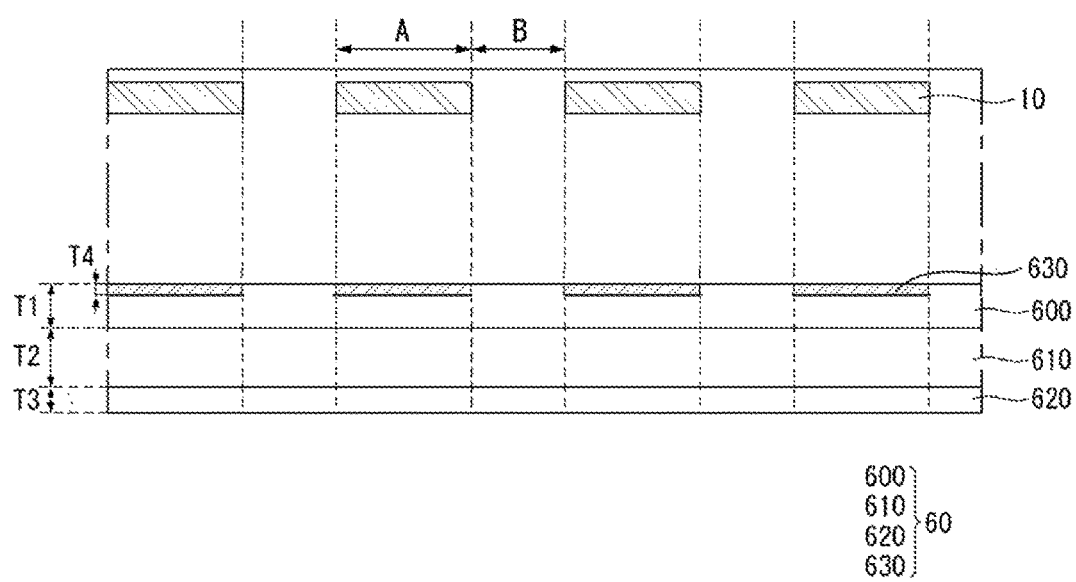
FIG. 10 is a view for illustrating an example of a solar cell module according to the other embodiment of the invention.

Referring to FIG. 4A, the anti-reflection layer 630 may be located on the back surface of the second sheet layer 620, and may be selectively formed only in the first area A. For example, in FIG. 4A to 4C, the anti-reflection layer 630 is formed to have a film shape as a whole in the first area A and the second area B. The anti-reflection portion or the anti-reflection material may be located corresponding to the first area A, and not located in the second area B. However, the embodiment of the invention is not limited thereto. Therefore, as shown in FIG. 10, it is also possible that the anti-reflection layer 630 itself is located corresponding to the first area A, and not formed in the second area B.

Accordingly, the solar cell module 100 including the anti-reflection layer 630 reduces reflectivity of light of 300 nm to 1200 nm wavelength band, and back surface output value rises about 1 to 7%. Thus, total power generation of the solar cell module 100 has risen about 0.5 to 4%. At this time, the light of 300 nm to 1200 nm wavelength band may have a transmittance of more than 85%.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T4 of the anti-reflection layer 630 may be 80 to 150 nm. When the thickness T4 of the anti-reflection layer 630 is less than 80 nm, it may be difficult to have a passivation function and photoelectric efficiency. On the other hand, when the thickness T4 of the anti-reflection layer 630 is greater than 150 nm, it may be cause of an increase in a thickness and a cost rise.

Figure 4B:
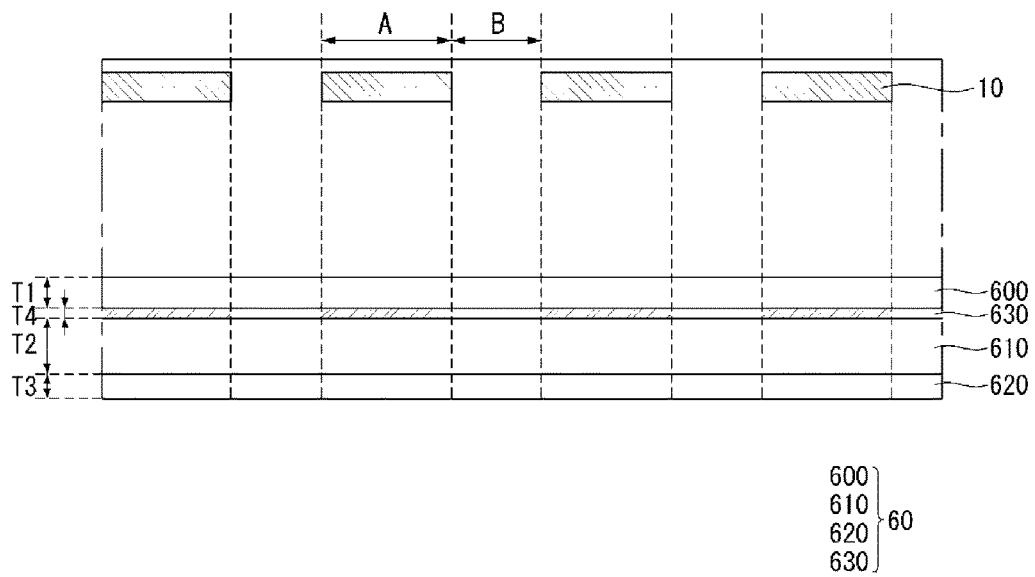

Referring to FIG. 4B, the anti-reflection layer 630 may be located between the first sheet layer 600 and the base layer 610, and may be selectively formed only in the first area A.

The anti-reflection layer 630 may be formed of at least one of silicon oxide (SiOx), aluminum oxide (AlOx), and zinc oxide (ZnOx).

Accordingly, the solar cell module 100 including the anti-reflection layer 630 reduces reflectivity of light of 300 nm to 1200 nm wavelength band, and back surface output value rises about 1 to 7%. Thus, total power generation of the solar cell module 100 has risen about 0.5 to 4%. At this time, the light of 300 nm to 1200 nm wavelength band may have a transmittance of more than 85%.

Because a method for forming the anti-reflection layer 630 is the same as or very similar to the method described above, a detailed description is omitted.

The thickness T4 of the anti-reflection layer 630 may be 80 to 150 nm. When the thickness T4 of the anti-reflection layer 630 is less than 80 nm, it may be difficult to have a passivation function and photoelectric efficiency. On the other hand, when the thickness T4 of the anti-reflection layer 630 is greater than 150 nm, it may be cause of an increase in a thickness and a cost rise.

Figure 4C:
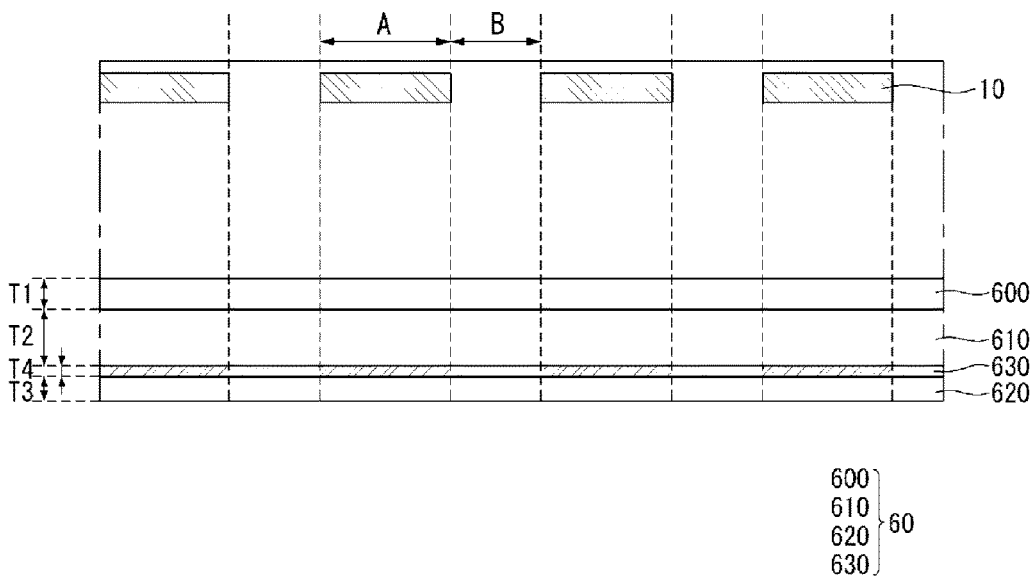

Referring to FIG. 4C, the anti-reflection layer 630 may be located between the base layer 610 and the second sheet layer 620, and may be selectively formed only in the first area A.

Accordingly, the solar cell module 100 including the anti-reflection layer 630 reduces reflectivity of light of 300 nm to 1200 nm wavelength band, and back surface output value rises about 1 to 7%. Thus, total power generation of the solar cell module 100 has risen about 0.5 to 4%. At this time, the light of 300 nm to 1200 nm wavelength band may have a transmittance of more than 85%.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T4 of the anti-reflection layer 630 may be 80 to 150 nm. When the thickness T4 of the anti-reflection layer 630 is less than 80 nm, it may be difficult to have a passivation function and photoelectric efficiency. On the other hand, when the thickness T4 of the anti-reflection layer 630 is greater than 150 nm, it may be cause of an increase in a thickness and a cost rise.

Figure 5A:
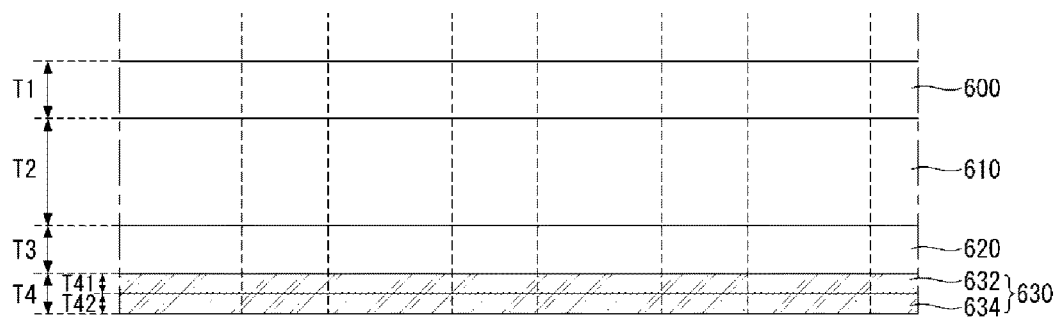
FIGS. 5A to 5C are cross-sectional views for illustrating an embodiment of formation position of an anti-reflection layer included in a back sheet shown in FIG. 1.

Referring to FIG. 5A, the anti-reflection layer 630 may include a first anti-reflection layer 632 and a second anti-reflection layer 634 that are continuously formed and be in contact with each other, and may be formed on both the first area A and the second area B.

The anti-reflection layer 630 may include the first anti-reflection layer 632 that is located on the back surface of the second sheet layer 620 and the second anti-reflection layer 634 that is located on the first anti-reflection layer 632.

The first anti-reflection layer 632 and the second anti-reflection layer 634 are located continuously. Thus, the transmittance increases further and the efficiency of the solar cell module 100 can be further increased.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T41 of the first anti-reflection layer 632 and the thickness T42 of the second anti-reflection layer 634 may be 80 to 150 nm, respectively. When the thickness T41 of the first anti-reflection layer 632 and the thickness T42 of the second anti-reflection layer 634 are less than 80 nm, it may be difficult to have a passivation function and photoelectric efficiency. On the other hand, when the thickness T41 of the first anti-reflection layer 632 and the thickness T42 of the second anti-reflection layer 634 are greater than 150 nm, it may be cause of an increase in a thickness and a cost rise.

Figure 5B:
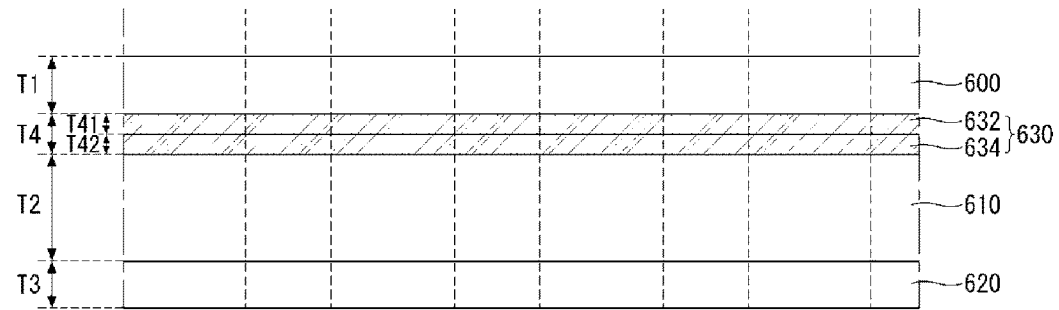

Referring to FIG. 5B, the anti-reflection layer 630 may include a first anti-reflection layer 632 and a second anti-reflection layer 634 that are continuously formed, and may be formed on both the first area A and the second area B.

The anti-reflection layer 630 may be located between the first sheet layer 600 and the base layer 610, and include the first anti-reflection layer 632 that is located on the back surface of the first sheet layer 600 and the second anti-reflection layer 634 that is located on the back surface of the first anti-reflection layer 632.

The first anti-reflection layer 632 and the second anti-reflection layer 634 are located continuously. Thus, the transmittance increases further and the efficiency of the solar cell module 100 can be further increased.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T41 of the first anti-reflection layer 632 and the thickness T42 of the second anti-reflection layer 634 may be 80 to 150 nm, respectively. When the thickness T41 of the first anti-reflection layer 632 and the thickness T42 of the second anti-reflection layer 634 are less than 80 nm, it may be difficult to have a passivation function and photoelectric efficiency. On the other hand, when the thickness T41 of the first anti-reflection layer 632 and the thickness T42 of the second anti-reflection layer 634 are greater than 150 nm, it may be cause of an increase in a thickness and a cost rise.

Figure 5C:
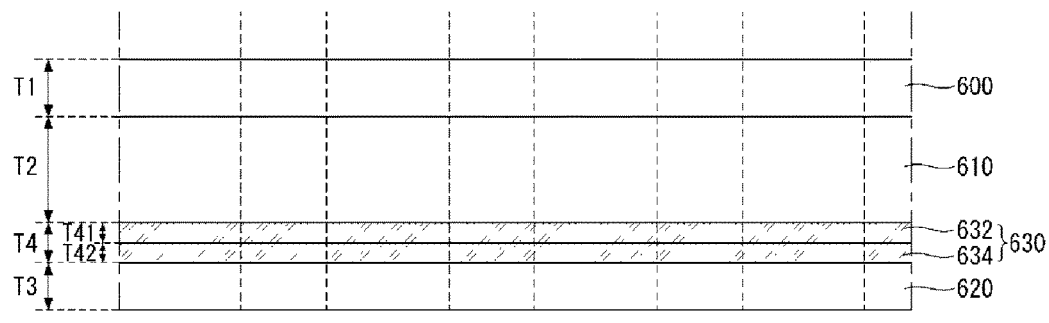

Referring to FIG. 5C, the anti-reflection layer 630 may include a first anti-reflection layer 632 and a second anti-reflection layer 634 that are continuously formed, and formed on both the first area A and the second area B.

The anti-reflection layer 630 may be located between the base layer 610 and the second sheet layer 620, and include the first anti-reflection layer 632 that is located on the back surface of the base layer 610 and the second anti-reflection layer 634 that is located on the back surface of the first anti-reflection layer 632.

The first anti-reflection layer 632 and the second anti-reflection layer 634 are located continuously. Thus, the transmittance increases further and the efficiency of the solar cell module 100 can be further increased.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T41 of the first anti-reflection layer 632 and the thickness T42 of the second anti-reflection layer 634 may be 80 to 150 nm, respectively. When the thickness T41 of the first anti-reflection layer 632 and the thickness T42 of the second anti-reflection layer 634 are less than 80 nm, it may be difficult to have a passivation function and photoelectric efficiency. On the other hand, when the thickness T41 of the first anti-reflection layer 632 and the thickness T42 of the second anti-reflection layer 634 are greater than 150 nm, it may be cause of an increase in a thickness and a cost rise.

Figure 6A:
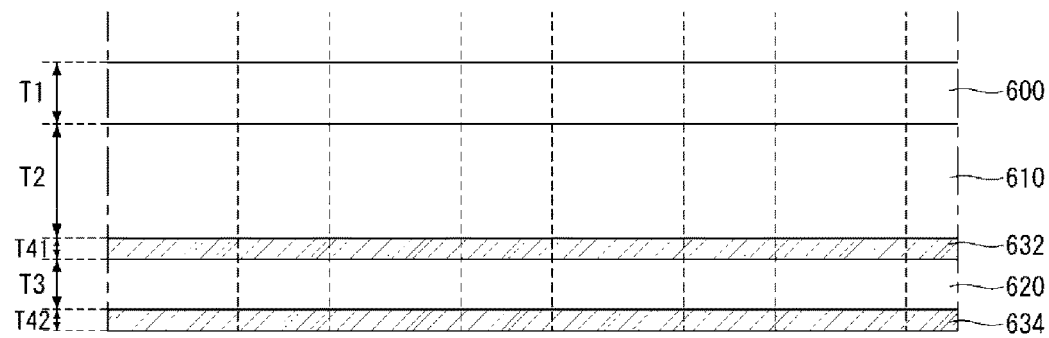
FIGS. 6A to 6B are cross-sectional views for illustrating an embodiment of formation position of an anti-reflection layer included in a back sheet shown in FIG. 1.

Referring to FIG. 6A, the anti-reflection layer 630 may include a first anti-reflection layer 632 and a second anti-reflection layer 634 that are discontinuously formed, and may be formed on both the first area A and the second area B. As such, if another layer is disposed between the plurality of anti-reflection layers 630 (that is, the first anti-reflection layer 632 and the second anti-reflection layer 634) and thus the plurality of anti-reflection layers 630 are spaced apart from each other, the anti-reflection effect can be largely enhanced.

The anti-reflection layer 630 may include the first anti-reflection layer 632 that is located between the base layer 610 and the second sheet layer 620, and the second anti-reflection layer 634 that is located on the back surface of the second sheet layer 620.

The first anti-reflection layer 632 and the second anti-reflection layer 634 are located discontinuously. Thus, the transmittance increases further and the efficiency of the solar cell module 100 can be further increased.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T41 of the first anti-reflection layer 632 and the thickness T42 of the second anti-reflection layer 634 may be 80 to 150 nm, respectively. When the thickness T41 of the first anti-reflection layer 632 and the thickness T42 of the second anti-reflection layer 634 are less than 80 nm, it may be difficult to have a passivation function and photoelectric efficiency. On the other hand, when the thickness T41 of the first anti-reflection layer 632 and the thickness T42 of the second anti-reflection layer 634 are greater than 150 nm, it may be cause of an increase in a thickness and a cost rise.

Figure 6B:
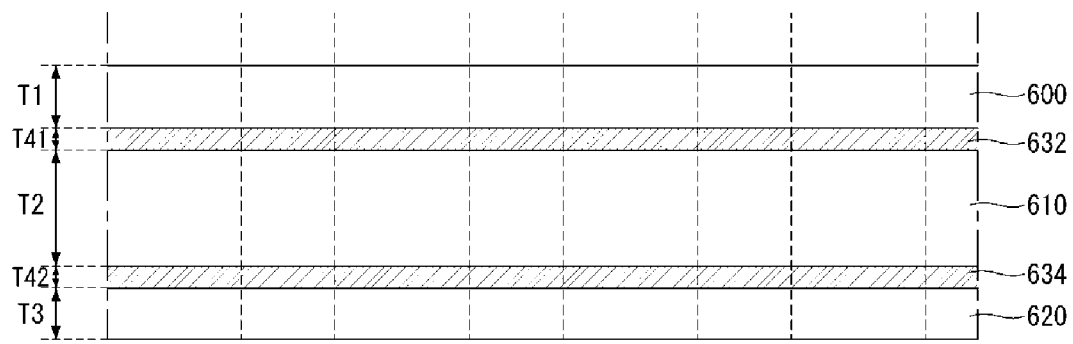

Referring to FIG. 6B, the anti-reflection layer 630 may include a first anti-reflection layer 632 and a second anti-reflection layer 634 that are discontinuously formed, and may be formed on both the first area A and the second area B.

The anti-reflection layer 630 may include the first anti-reflection layer 632 that is located between the first sheet layer 600 and the base layer 610, and the second anti-reflection layer 634 that is located on the back surface of the base layer 610.

The first anti-reflection layer 632 and the second anti-reflection layer 634 are located discontinuously. Thus, the transmittance increases further and the efficiency of the solar cell module 100 can be further increased.

The anti-reflection layer 630 may be formed of at least one of silicon oxide (SiOx), aluminum oxide (AlOx), and zinc oxide (ZnOx).

Because a method for forming the anti-reflection layer 630 is the same as or very similar to the method described above, a detailed description is omitted.

The thickness T41 of the first anti-reflection layer 632 and the thickness T42 of the second anti-reflection layer 634 may be 80 to 150 nm, respectively. When the thickness T41 of the first anti-reflection layer 632 and the thickness T42 of the second anti-reflection layer 634 are less than 80 nm, it may be difficult to have a passivation function and photoelectric efficiency. On the other hand, when the thickness T41 of the first anti-reflection layer 632 and the thickness T42 of the second anti-reflection layer 634 are greater than 150 nm, it may be cause of an increase in a thickness and a cost rise.

Hereafter, in FIGS. 7 to 10, described is a solar cell module according to another embodiment of the invention. In the following FIGS. 7 to 10, a detailed description repeating content described in FIGS. 1 to 2 is omitted, and only the differences are mainly described.

Figure 7:
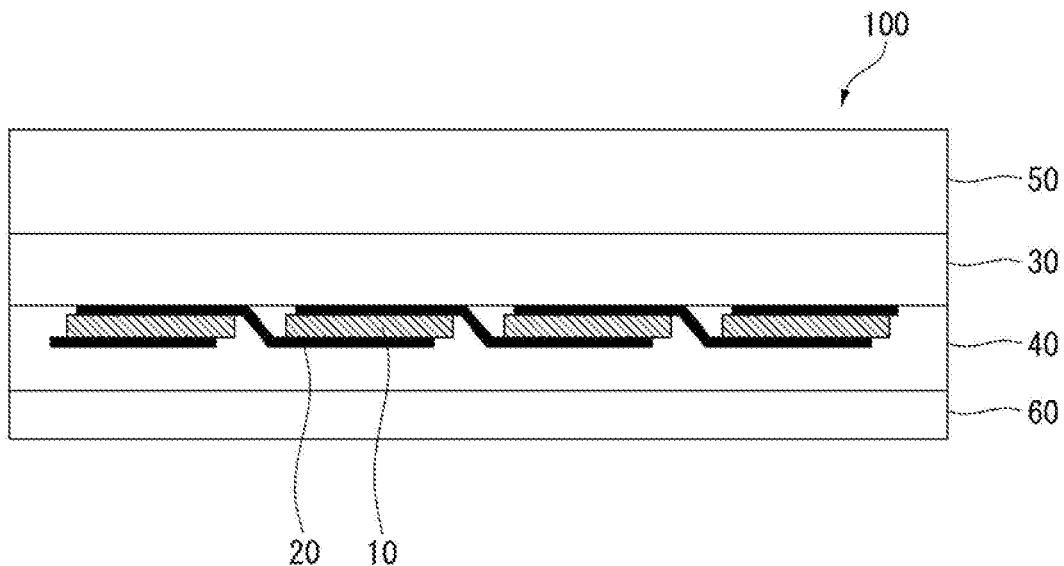
FIGS. 7 to 9 illustrate an example of a solar cell module according to another embodiment of the invention.

Referring to FIG. 7, an interconnector 20 connected to a plurality of solar cells 10 may be in contact with a lower surface of a front protection unit 30 and an upper surface of a back protection unit 40. In this instance, an upper surface of the solar cell 10 may be covered with the front protection unit 30. A side and a lower surface of the solar cell 10 may be covered with the back protection unit 40.

On the other hand, when a thickness of the back protection unit 40 that is located at the back surface of the solar cell 10 is greater than a thickness of the front protection unit 30, the solar cell 10 can be more stably protected from external impact or contaminants. It is possible to increase weather resistance of the solar cell module 100 and extend life of the solar cell module 100.

Figure 8:
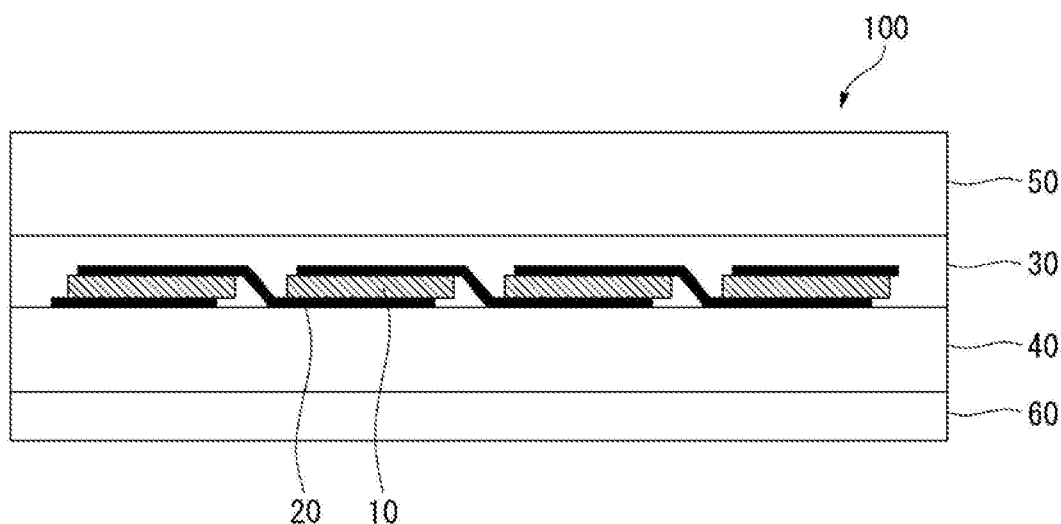

In addition, as shown in FIG. 8, an interconnector 20 connected to a plurality of solar cells 10 may be embedded into the front protection unit 30. In this instance, the solar cell 10 may be covered with the front protection unit 30.

Figure 9:
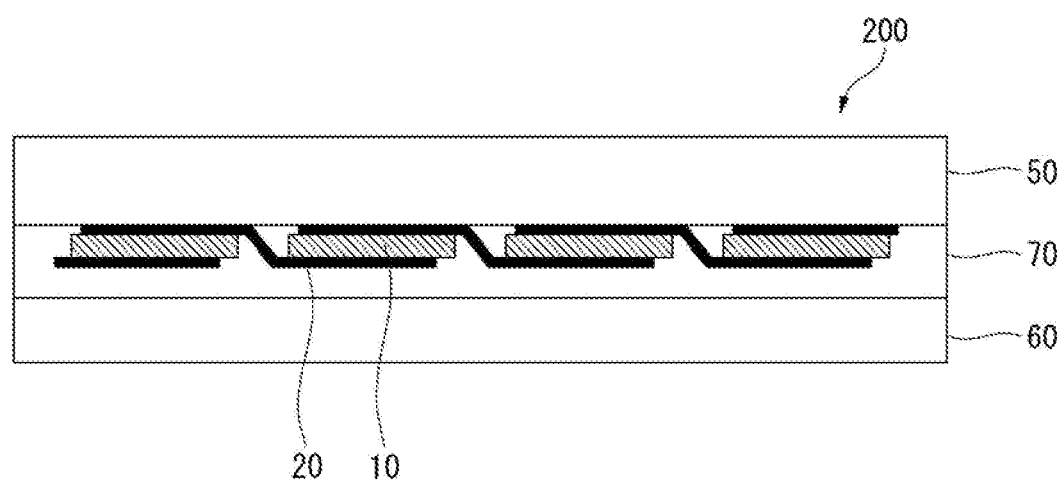

In addition, as shown in FIG. 9, a solar cell module 200 according to another embodiment of the invention may include a plurality of solar cells 10, an interconnector 20 electrically connecting the plurality of solar cells 10, a protection unit 70 protecting the plurality of solar cells 10, a front light transmitting sheet 50 which is located in a front surface of the solar cell 10, and a back sheet 60 which is located on a back surface of the solar cell 10. In this instance, the protection unit 70 may be configured in a single layer.

In the solar cell module 200 shown in FIG. 9, the remaining configuration except the protection unit 70 consisting of a single-layer is the same as that of the solar cell module 100 shown in FIG. 1. Hereinafter, described is only the positional relationship among the protection unit 70, the interconnector 20, and the solar cell 10.

Thus, the same reference numbers are given to components performing the same function as the solar cell module 100 shown in FIG. 1. Detailed description of redundant feature is omitted.

The interconnector 20 connected to the plurality of solar cells 10 may be in contact with a lower surface of the front light transmitting sheet 50 and an upper surface of the protection unit 70. In this instance, an upper surface of the solar cell 10 may be covered with the front light transmitting sheet 50. A side and a lower surface of the solar cell 10 may be covered with the protection unit 70.

As shown in FIG. 10 illustrating another embodiment, the anti-reflection layer 630 may be located adjacent (as an example, contact) to the back protection unit 40. As an example, the anti-reflection layer 630 may be located on a surface adjacent (as an example, contact) to the back protection unit 40 in the first sheet layer 600.

In FIG. 10, the anti-reflection layer 630 is selectively formed corresponding to the first area A, but not formed in the second area B. However, the embodiment of the invention is not limited thereto. Therefore, as shown in FIGS. 3A to 3C, the anti-reflection layer 630 may be formed entirely over the first area A and the second area B. In addition, in FIG. 10, the anti-reflection layer 630 consists of a single layer. However, the embodiment of the invention is not limited thereto. Therefore, as shown in FIGS. 5A to 5C, the anti-reflection layer 630 may include the first anti-reflection layer 632 and the second anti-reflection layer 634 or may be composed of three or more anti-reflective films. In addition to the anti-reflection layer 630 shown in FIG. 10, the anti-reflection layer 630 shown in FIGS. 3A to 3C, FIGS. 4A to 4C, FIGS. 5A to 5C, and FIGS. 6A and 6B may be further provided.

The embodiments and modification thereof described above can be freely combined. They also are within the scope of the invention. For example, combinations of the solar cell module 100 of FIGS. 1, 7 to 9 and the structures of FIGS. 3C, 4A to 4C, 5A to 5C, 6A, 6B, and 10 also are within the scope of the invention. Other various modifications also are within the scope of the invention.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A bi-facial solar cell module, comprising:
    a plurality of solar cells;
    a front transparent glass substrate on front surfaces of the plurality of solar cells;
    a back transparent sheet on back surfaces of the plurality of solar cells,
    wherein the back transparent sheet includes a base layer made of at least one of polyethylene terephthalate (PET) and polyamide and having a first surface facing the plurality of solar cells and a second surface opposite to the first surface, a first sheet layer made of at least one of fluoropolymer (FP), ethylene vinyl acetate (EVA), polypropylene (PP), and polyethylene (PE) and formed on the first surface of the base layer, and a second sheet layer made of at least one of polyvinyl fluoride (PVF), polyvinylidene fluoride (PVDF), ethylene tetrafluoroethylene (ETFE) and polyamide and formed on the second surface of the base layer;

a front protection unit between the front transparent glass substrate and the plurality of solar cells; and a back protection unit between the back transparent sheet and the plurality of solar cells, wherein an anti-reflection layer is directly positioned on an air-side surface of the back transparent sheet, and wherein a material of the second sheet layer is different from a material of the first sheet layer.

2. The bi-facial solar cell module of claim 1, wherein the back transparent sheet includes:

a first area that overlaps with a portion of the plurality of solar cells; and a second area that is a remaining portion other than the first area, wherein the anti-reflection layer is selectively located in the first area.

3. The bi-facial solar cell module of claim 1, wherein the anti-reflection layer includes at least one of silicon oxide (SiOx), aluminum oxide (AlOx), and zinc oxide (ZnOx).

4. The bi-facial solar cell module of claim 1, wherein the first sheet layer is formed on an entire first surface of the base layer.

5. The bi-facial solar cell module of claim 4, wherein the anti-reflection layer is formed on a surface of the second sheet layer opposite to the base layer.

6. The bi-facial solar cell module of claim 4, wherein the anti-reflection layer is formed between the first sheet layer and the base layer.

7. The bi-facial solar cell module of claim 4, wherein the anti-reflection layer is formed between the base layer and the second sheet layer.

8. The bi-facial solar cell module of claim 4, wherein the anti-reflection layer is formed between the first sheet layer and the back protection unit.

9. The bi-facial solar cell module of claim 1, wherein the anti-reflection layer includes a first anti-reflection layer and a second anti-reflection layer that is located adjacent to the first anti-reflection layer.

10. The bi-facial solar cell module of claim 1, wherein the anti-reflection layer includes a first anti-reflection layer and a second anti-reflection layer that is spaced apart from the first anti-reflection layer.

11. The bi-facial solar cell module of claim 4, wherein a thickness of the anti-reflection layer is smaller than the other layers of the back transparent sheet.

12. The bi-facial solar cell module of claim 4, wherein a thickness of the anti-reflection layer is 80 to 150 nm.

13. The bi-facial solar cell module of claim 4, wherein a thickness of the first sheet layer and a thickness of the second sheet layer are different from each other, and wherein the thickness of the second sheet layer is smaller than the thickness of the first sheet layer.

14. The bi-facial solar cell module of claim 11, wherein the thickness of the first sheet layer is 250 μm or less, and the thickness of the second sheet layer is 60 μm or less.

15. A bi-facial solar cell module, comprising:

a plurality of solar cells;

a front transparent glass substrate on front surfaces of the plurality of solar cells;

a back transparent sheet on back surfaces of the plurality of solar cells, wherein the back transparent sheet includes a base layer made of at least one of polyethylene terephthalate (PET) and polyamide and having a first surface facing the plurality of solar cells and a second surface opposite to the first surface, a first sheet layer made of at least one of fluoropolymer (FP), ethylene vinyl acetate (EVA), polypropylene (PP), and polyethylene (PE) and formed on the first surface of the base layer, and a second sheet layer made of at least one of polyvinyl fluoride (PVF), polyvinylidene fluoride (PVDF), ethylene tetrafluoroethylene (ETFE) and polyamide and formed on the second surface of the base layer;

a front protection unit between the front transparent glass substrate and the plurality of solar cells; and a back protection unit between the back transparent sheet and the plurality of solar cells, wherein an oxide layer is directly positioned on an air-side surface of the back transparent sheet, and wherein a material of the second sheet layer is different from a material of the first sheet layer.

16. The bi-facial solar cell module of claim 15, wherein the back transparent sheet includes:

a first area that overlaps with a portion of the plurality of solar cells; and a second area that is a remaining portion other than the first area, wherein the oxide layer is selectively located in the first area.

17. The bi-facial solar cell module of claim 15, wherein the oxide layer includes at least one of silicon oxide (SiOx), aluminum oxide (AlOx), and zinc oxide (ZnOx).

18. The bi-facial solar cell module of claim 1, wherein the anti-reflection layer includes an oxide in an amount of about 1.5% wt %, a binder in an amount of about 1.5% wt %, and a solvent in an amount of about 96 wt %.

19. The bi-facial solar cell module of claim 15, wherein the anti-reflection layer includes an oxide in an amount of about 1.5% wt %, a binder in an amount of about 1.5% wt %, and a solvent in an amount of about 96 wt %.

* * * * *